United States Patent [19]
An et al.

[11] Patent Number: 5,536,668
[45] Date of Patent: Jul. 16, 1996

[54] METHOD OF MANUFACTURING A VIRTUAL GROUND SPLIT GATE NONVOLATILE MEMORY DEVICE

[75] Inventors: Jae C. An, Seoul; Hee H. Chang, Kyungki-Do both of Rep. of Korea

[73] Assignee: Hyundai Electronics Industries, Co., Ltd., Kyunghi-Do, Rep. of Korea

[21] Appl. No.: 525,150

[22] Filed: Sep. 8, 1995

[30] Foreign Application Priority Data

Sep. 13, 1994 [KR] Rep. of Korea .................. 94-23015

[51] Int. Cl.$^6$ .............................................. H01L 21/8247
[52] U.S. Cl. .................. 437/43; 437/44; 437/979
[58] Field of Search .................. 437/43, 44, 49, 437/979, 984; 148/DIG. 163

[56] References Cited

U.S. PATENT DOCUMENTS

| | | | |
|---|---|---|---|
| 5,151,375 | 9/1992 | Kazerounian et al. | 437/43 |
| 5,162,247 | 11/1992 | Hazani | 437/43 |
| 5,364,806 | 11/1994 | Ma et al. | 437/43 |
| 5,429,969 | 7/1995 | Chang | 437/44 |

*Primary Examiner*—Chandra Chaudhari
*Attorney, Agent, or Firm*—Fish & Richardson

[57] ABSTRACT

The present invention discloses a method of manufacturing a nonvolatile memory device. According to the present invention, in a nonvolatile memory device in which an equal voltage is applied to the control gates formed along both sides of the bit lines, the continuity of the control gates can be enhanced by interconnecting these control gates inside the cell arrays, resulting in a higher integration of the device and a reduction of the production of resistance therein, thereby improving the yield of the device.

3 Claims, 4 Drawing Sheets

(PRIOR ART) FIG. 1
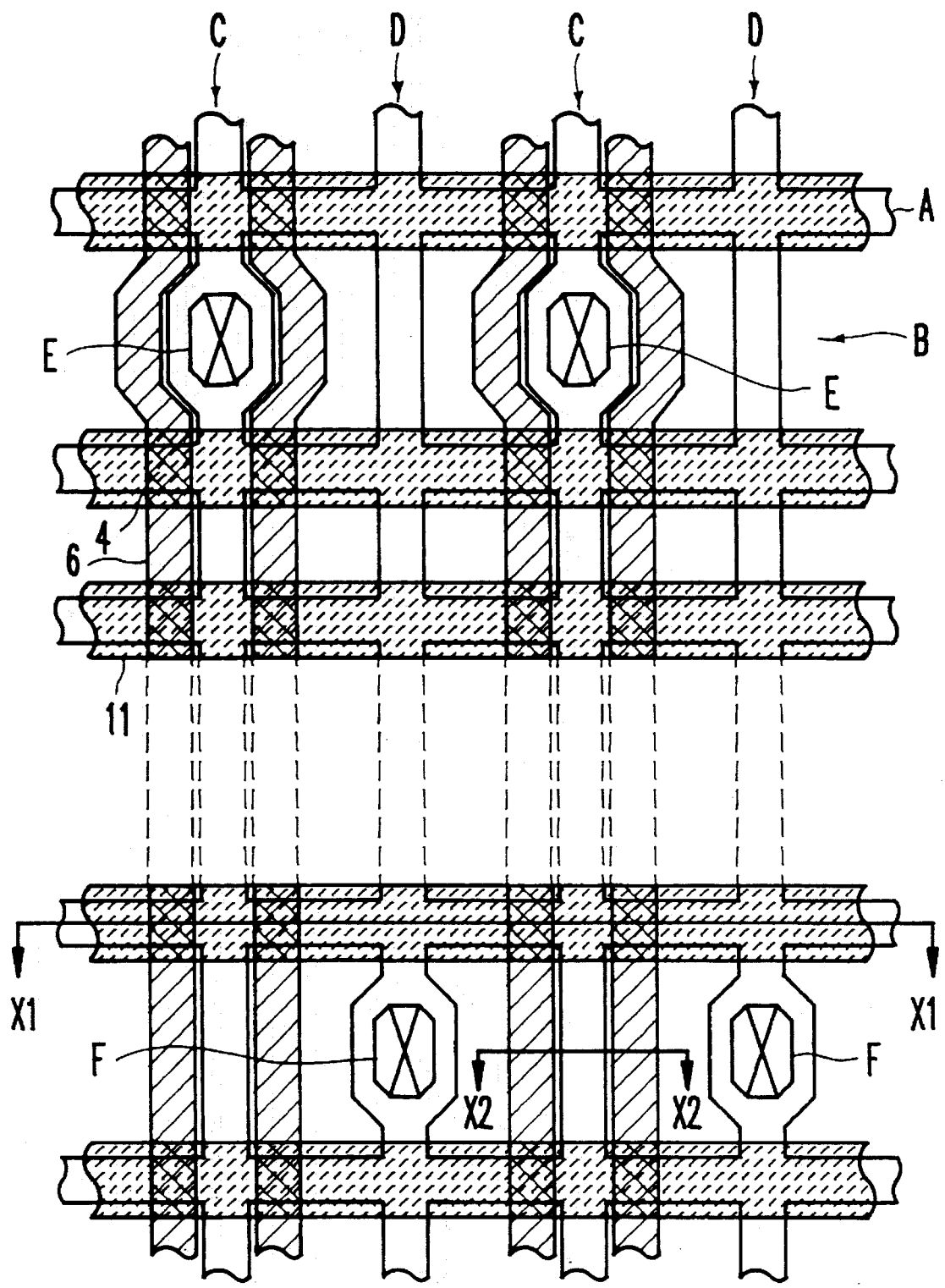

(PRIOR ART) FIG. 1A
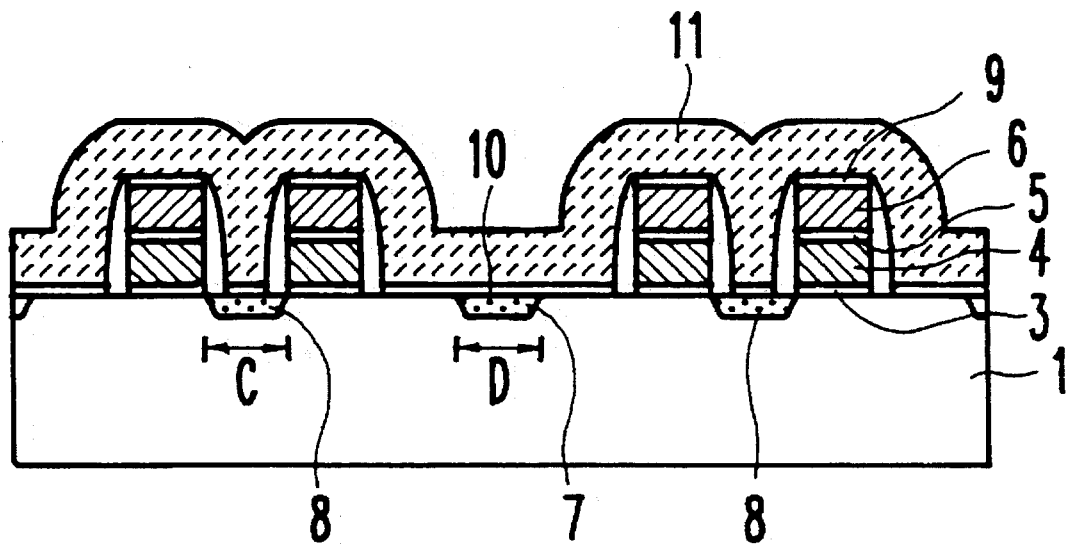
(PRIOR ART) FIG. 1B
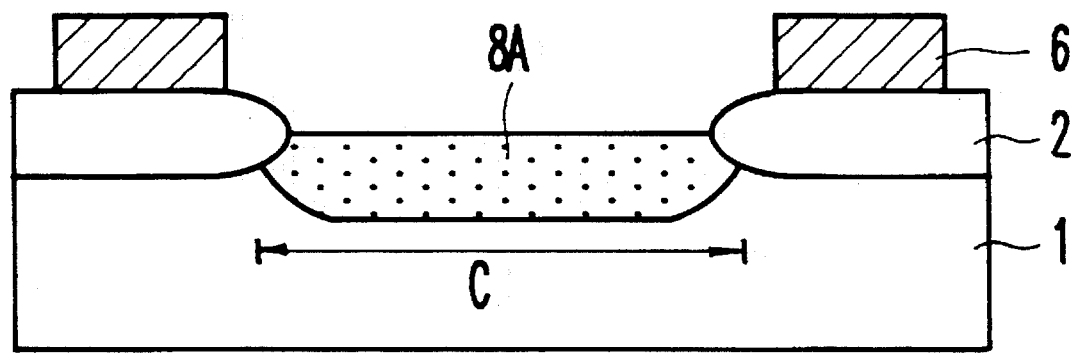

METHOD OF MANUFACTURING A VIRTUAL GROUND SPLIT GATE NONVOLATILE MEMORY DEVICE

FIELD OF THE INVENTION

The present invention relates to a method of manufacturing a nonvolatile memory device, and more particularly to a method of manufacturing a nonvolatile memory device which can improve the continuity of control gates by interconnecting such control gates that are formed along both sides of a bit line at the top the part of the bit line which passes along the side of a source contact.

BACKGROUND OF THE INVENTION

In a nonvolatile memory device such as a flash EEPROM(Electrically Erasable Programmable Read Only Memory), control gates are formed along both sides of a bit line, which are electrically connected on the outside of cell arrays.

FIG. 1 shows a layout illustrating arrays of a Virtual Ground Split Gate Cell, which is a flash EEPROM cell of a conventional nonvolatile memory device.

An active region A separated by a filed region B is defined to include a plurality of bit lines C, a plurality of virtual ground lines D, channels of a plurality of floating gates 4, and channels of a plurality of select gates 11. The bit lines C are formed longitudinally to include a drain contact E. The virtual ground lines D are formed longitudinally to include a source contact F. A plurality of unit cells are formed between the drain contact E and the source contact F. Between the bit lines C, the virtual ground lines D are formed one by one. Control gates 6 are formed along both sides of the bit lines C. The select gates 11 are formed transversely to overlap with the floating gates 4 and the control gates 6.

The process of manufacturing a conventional nonvolatile memory device will be described briefly by reference to FIG. 1A, a sectional view of the device along line X1—X1 in FIG. 1, and Fig. 1B, an enlarged sectional view of the device along line X2—X2 in FIG. 1.

The active region A and the filed region B are defined by a device isolation process. A filed oxide film 2 is formed on a silicon substrate 1 in the filed region B by an oxidation process. After a tunnel oxide film 3, a first polysilicon layer 4, interlayer insulation film 5 and a second polysilicon layer 6 are deposited on the entire silicon substrate 1, the first and second polysilicon layers 4 and 6 are patterned by a self-aligned etching method, thereby forming the floating gates 4 and the control gates 6. A source 7 and a drain 8 are formed by a source/drain mask work and an ion implantation process. Then, a diffusion layer 8A connecting the drain 8 of each of the unit cells and a diffusion layer(not shown) connecting the source 7 of each of the unit cells are formed simultaneously, thereby forming the bit lines C and the virtual ground lines D. An insulation film 9 is formed on the control gate 6. A select gate oxide film 10 is formed on the silicon substrate 1 of a select gate channel. A third polysilicon layer 11 is deposited on the entire structure. The third polysilicon layer 11 is patterned by a select gate mask work and an etching process, thereby forming the select gates 11.

The control gates 6 are formed along the sides of the bit lines C, which are electrically connected outside the cell arrays. If the device area is reduced for the purpose of higher integration, the control gates 4 cannot be made continuous due to the step coverage caused by the underlying layers and the subsequent processes such as the oxidation process resulting in an adverse effect on the productivity of the device.

SUMMARY OF THE INVENTION

Therefore, the object of the present invention is to provide a method of manufacturing a nonvolatile memory device which can improve the continuity of the control gates by connecting the control gates formed along both sides of the bit line which passes along the side of the source contact.

To achieve the object, a method of manufacturing a nonvolatile memory device, comprising the steps of:

forming sequentially a field oxide film, a tunnel oxide film, a first polysilicon layer and an interlayer insulation layer on a silicon substrate;

etching first the first polysilicon layer by a floating gate mask work and an etching process;

forming bit lines by an impurity ion implantation process;

forming a thick oxide film on the bit lines by an oxidation process;

forming a second polysilicon layer on the entire structure formed as a result of the processes;

etching the second polysilicon layer by a control gate mask work and an etching process, thereby forming control gates along both sides of the bit lines, and interconnecting the control gates at the upper portions of the bit lines;

etching second said first polysilicon layer by a self-aligned etching method, thereby forming floating gates;

forming a virtual ground line by an impurity ion implantation process;

forming an insulation film on the control gates and then forming a select gate oxide film by an oxidization process; and forming a third polysilicon layer on the entire structure formed as a result of the processes, and then etching the third polysilicon layer by a select gate mask work and an etching process, thereby forming the select gates.

BRIEF DESCRIPTION OF THE DRAWINGS

To better understand the nature and objective of the invention, reference should be made to the following detailed descriptions of the accompanying drawings in which:

FIG. 1 shows a layout illustrating cell arrays in a conventional nonvolatile memory device.

FIG. 1A is a sectional view of the device along line X1—X1 in FIG. 1.

FIG. 1B is an enlarged sectional view of the device along the X2—X2 in FIG. 1.

Similar reference characters refer to similar parts through the several views of the drawings.

DETAILED DESCRIPTION OF THE INVENTION

Below, the present invention will be described in detail by reference to the accompanying drawings.

Figure 2:
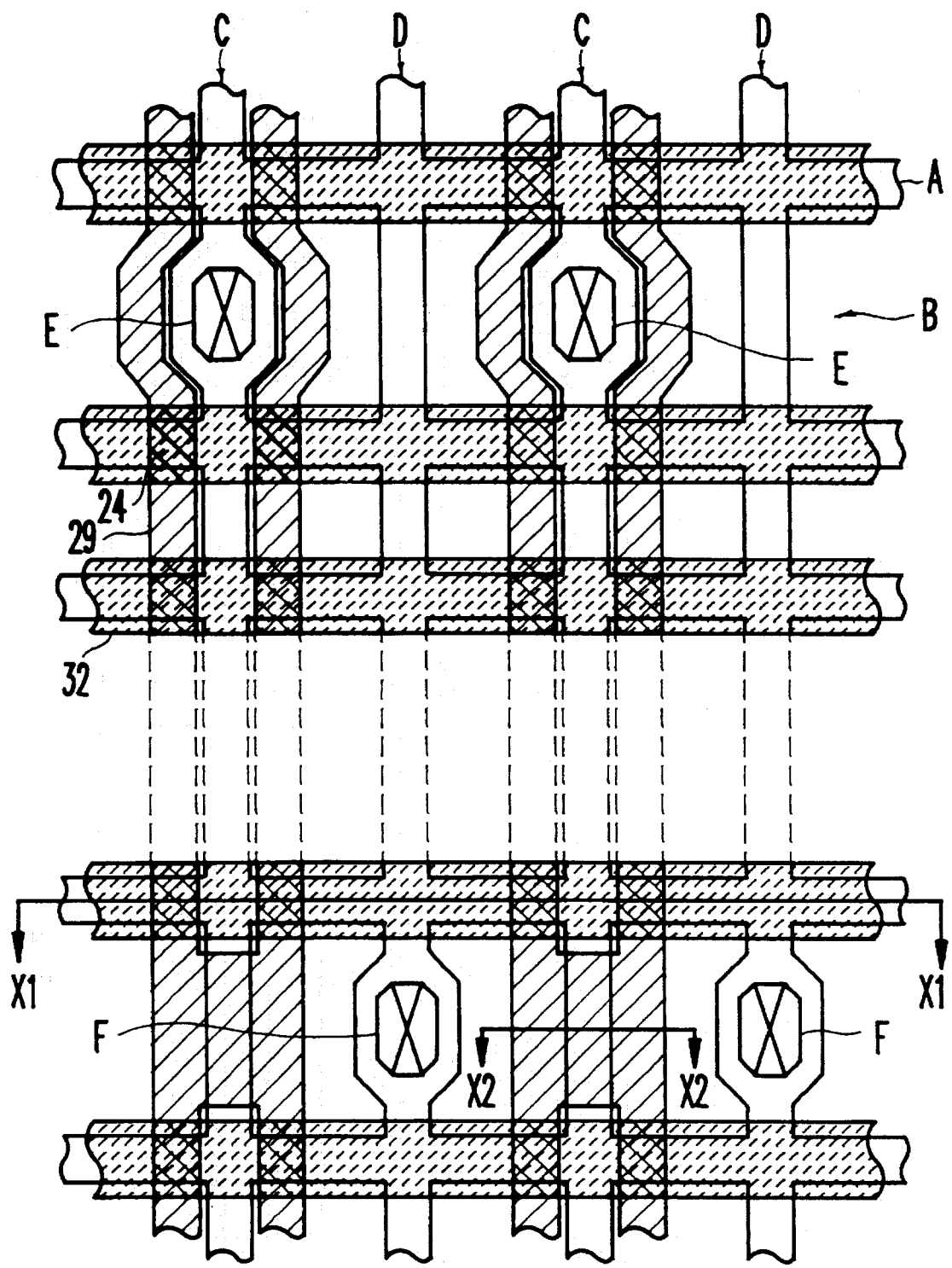
FIG. 2 shows a layout illustrating cell arrays in a nonvolatile memory device according to the present invention.
Figure 2A:
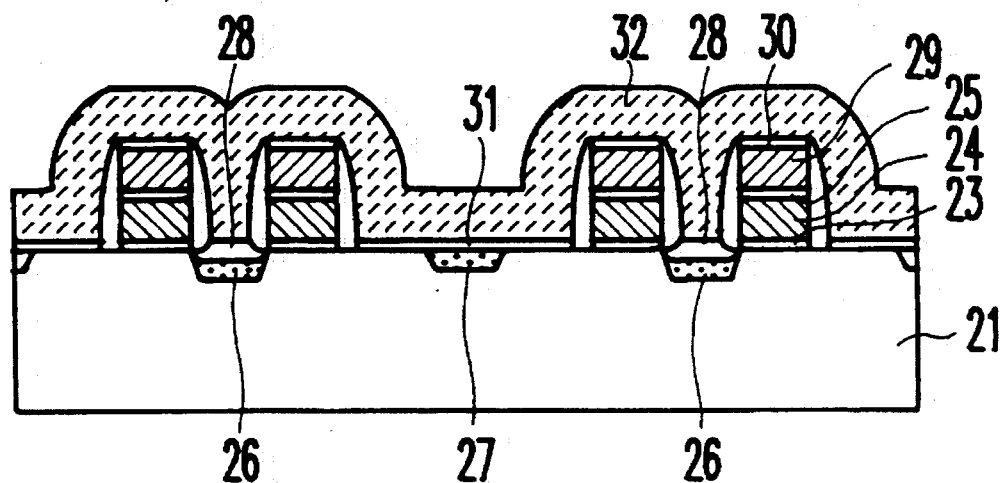
FIG. 2A is a sectional view of the device along line X1—X1 in FIG. 2.
Figure 2B:
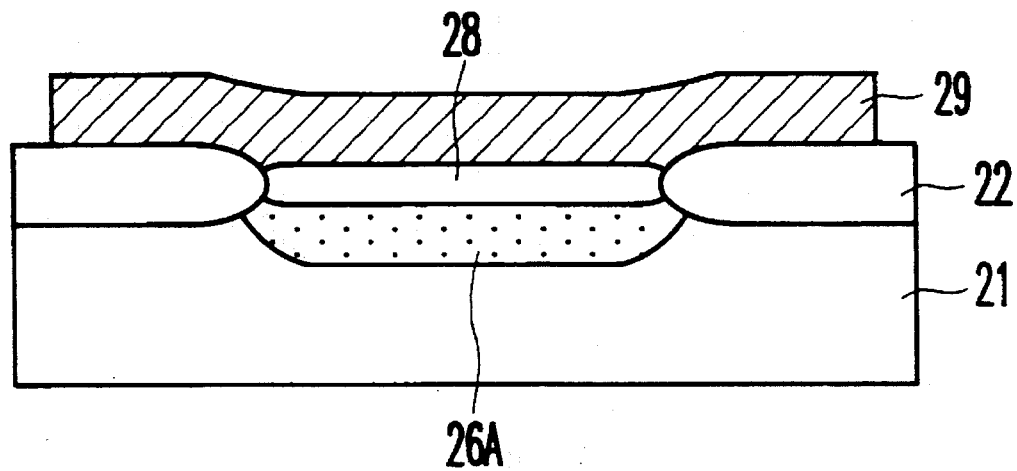
FIG. 2B is an enlarged sectional view of the device along line X2—X2 in FIG. 2.

In the drawings, FIG. 2 shows a layout illustrating the cell arrays in a nonvolatile memory according to the present invention; FIG. 2A is a sectional view of the device along line X1—X1 in FIG. 2; and FIG. 2B is an enlarged sectional view of the device along line X2—X2 in FIG. 2. The manufacturing process of the present invention will be described by reference to the drawings.

First, an active region A and a filed region B are defined by a device isolation process. A field oxide film 22 is formed on a silicon substrate 21 in the filed region B by an oxidization process. After a tunnel oxide film 23, a first polysilicon layer 24 and an interlayer insulation film 25 are formed on the entire silicon substrate 21, the first polysilicon layer 24 is etched first by a floating gate mask work and an etching process. The first polysilicon layer 24 being etched first causes the silicon substrate 21 in the bit lines C and the field oxide film 22 to be exposed, and the channels of the floating gates, the channels of the select gates, and the silicon substrate 21 in the portion of the virtual ground lines D to be covered sufficiently.

As the impurity ions are implanted into the silicon substrate 21 in the exposed portion of the bit lines C, the drains 26 of each of the unit cells and a diffusion layer 26A connecting these drains 26 are formed.

A thick oxide film 28 is formed on the bit lines C into which impurity ions are implanted by an oxidation process.

On the entire structure formed as a result of the processes a second polysilicon layer 29 is formed. The second polysilicon layers 29 are etched by a control gate mask work and an etching process and thereby the control gates 29 are formed along both sides of the bit lines C. However, these control gates 29 are formed to be interconnected at the upper portion of the bit lines C which passes along the side of the source contact F. As the etching process continues, the first polysilicon layer 24 etched first is etched second by a self-aligned etching method, thereby forming the floating gates 24.

The important facet of the above process is that the control gates 29 formed along both sides of the bit lines C are electrically interconnected inside the cell arrays.

Then, the silicon substrate 21 in the virtual ground lines D is exposed by a mask work. The impurity ions are implanted into the exposed silicon substrate 21, thereby forming the sources 27 of each of the unit cells and a diffusion layer (not shown) connecting these sources 27. An insulation film 30 is formed on the surfaces of the control gates 29. A select gate oxide film 31 is formed by an oxidation process. On the entire structure formed as a result of the processes a third polysilicon layer 32 is formed. The third polysilicon layer 32 is etched by a select gate mask work and an etching process, thereby forming the select gates 32.

Although this embodiment of the present invention described the case where the control gates 29 are interconnected at the upper portion of the bit lines C which pass along the side of the source contact F, the control gates 29 can be formed at the whole upper portions of the bit lines C except for the drain contact E.

According to the present invention, in a nonvolatile memory device in which equal voltage is applied to the control gates formed along both sides of the bit lines, the continuity of the control gates can be enhanced by interconnecting these control gates inside the cell arrays, resulting in a higher integration of the device and a reduction of resistance, thereby improving the yield of the device.

Although this invention has been described in its preferred embodiment with a certain degree of particularity, one skilled in the art would know that the preferred embodiment disclosed here is only an example and that the construction, combination and arrangement of its parts may be varied without departing from the spirit and the scope of the invention.

What is claimed is:

1. A method of manufacturing a nonvolatile memory device, comprising the steps of:

forming sequentially a field oxide film, a tunnel oxide film, a first polysilicon layer and an interlayer insulation layer on a silicon substrate;

etching first said first polysilicon layer by a floating gate mask work and an etching process;

forming bit lines by an impurity ion implantation process;

forming a thick oxide film on said bit lines by an oxidation process;

forming a second polysilicon layer on the entire structure formed as a result of said processes;

etching said second polysilicon layer by a control gate mask work and an etching process, thereby forming control gates along both sides of said bit lines, and interconnecting said control gates at the upper portions of said bit lines;

etching second said first polysilicon layer by a self-aligned etching method, thereby forming floating gates;

forming a virtual ground line by an impurity ion implantation process;

forming an insulation film on said control gates and then forming a select gate oxide film by an oxidization process; and forming a third polysilicon layer on the entire structure formed as a result of said processes, and then etching said third polysilicon layer by a select gate mask work and an etching process, thereby forming the select gates.

2. The method of claim 1 wherein said control gates formed along both sides of said bit line are interconnected at the upper portion of said bit line which passes along the side of the source contact.

3. The method of claim 1 wherein said control gates formed along both sides of said bit line are interconnected at the whole upper portions of said bit line except for the drain contact.

* * * * *